United States Patent [19]

Tournois et al.

[11] 4,159,539

[45] Jun. 26, 1979

[54] ELASTIC WAVES DEVICE FOR MEMORIZING INFORMATION

[75] Inventors: Pierre Tournois; Charles Maerfeld, both of Paris, France

[73] Assignee: Thomson-CSF, Paris, France

[21] Appl. No.: 875,081

[22] Filed: Feb. 3, 1978

Related U.S. Application Data

[63] Continuation of Ser. No. 628,997, Nov. 5, 1975, abandoned.

[30] Foreign Application Priority Data

Nov. 8, 1974 [FR] France .................................. 74 37078

[51] Int. Cl.$^2$ .............................................. G11C 21/02
[52] U.S. Cl. ....................................... 365/157; 365/189
[58] Field of Search ........................................... 365/157

[56] References Cited

U.S. PATENT DOCUMENTS

| | | | |
|---|---|---|---|
| 2,863,076 | 12/1958 | Koren .................................. | 365/157 |
| 3,132,257 | 5/1964 | Yando .................................. | 365/157 |
| 3,320,596 | 5/1967 | Smith .................................. | 365/157 |
| 3,448,437 | 6/1969 | Barnett .................................. | 365/157 |
| 3,492,667 | 1/1970 | Gratian .................................. | 365/157 |
| 3,564,515 | 2/1971 | Gratian .................................. | 365/157 |
| 3,701,147 | 10/1972 | Whitehouse .......................... | 365/157 |
| 3,886,527 | 5/1975 | Bert et al. ............................. | 365/157 |
| 3,921,154 | 11/1975 | Barkley ................................. | 365/157 |

*Primary Examiner*—Terrell W. Fears
*Attorney, Agent, or Firm*—Cushman, Darby & Cushman

[57] ABSTRACT

A device for memorizing information by means of interactions between elastic waves and electromagnetic waves. It comprises a piezoelectric substrate, at least one electromechanical transducer receiving the information to be memorized, means for exciting a pulsating electric field through the substrate, said field interacting non-linearly with the elastic wave created by the transducer to form a spatial charge pattern representing said information and means for modifying the physical properties of the medium of propagation of the elastic waves in the region of said pattern, for memorizing. The reading is effected by a non-linear interaction between said pattern and the pulsating electric field.

24 Claims, 6 Drawing Figures

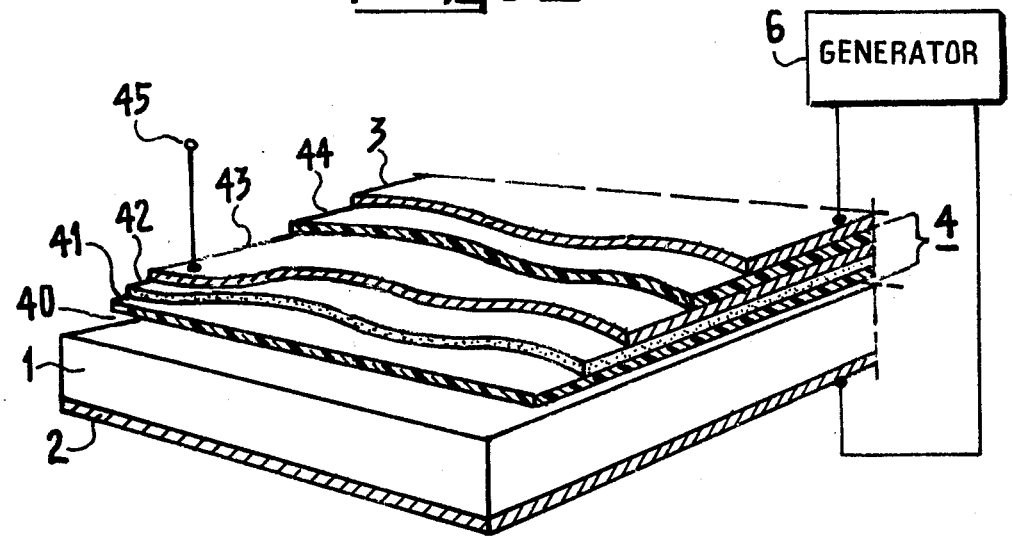
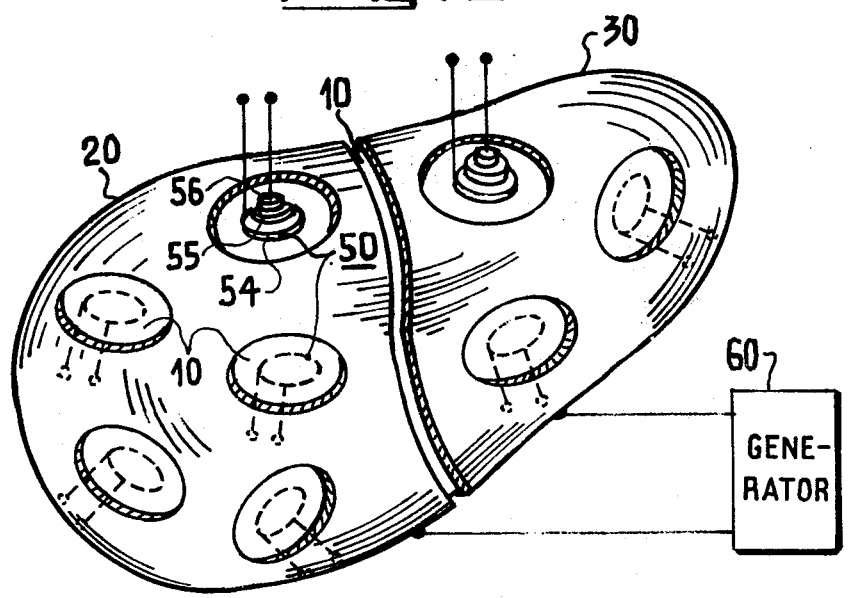

ELASTIC WAVES DEVICE FOR MEMORIZING INFORMATION

This is a continuation, of application Ser. No. 628,997 filed Nov. 5, 1975, now abandoned.

The present invention relates to the field of memorization of information and more particularly relates to a device employing interactions between elastic waves and electromagnetic waves for memorizing electric signals.

Various devices are known which employ interactions between elastic waves, that is to say vibratory disturbances from compression or shear of different frequencies for the purpose of the analysis in amplitude and frequency of electric or optical images converted into elastic waves but without a memory effect. Examples of these devices are disclosed in French Pat. applications Nos. 73.38912 and 74.10300.

An object of the present invention is to provide a device for memorizing information which employs such interactions to produce a spatial and periodic pattern representing the information, and means for modifying the medium of propagation of the elastic waves in the region of this pattern so as to keep the information.

According to the invention, there is provided a device for memorizing information employing elastic waves, comprising:

a piezoelectric substrate;

at least one electromechanical transducer deposited on a surface of said substrate, receiving said information in the form of an electric signal and emitting a first elastic wave;

first means for exciting a first electromagnetic field through the substrate, said electromagnetic field interacting with said elastic wave so as to produce a time-independant spatial charge pattern representing said information;

means for fixing said pattern;

means for reading said information, constituted by second means for exciting a second electromagnetic field through the substrate, said second field interacting with said pattern so as to produce a second elastic wave, termed a reading wave, having the same characteristics as said first elastic wave but propagating in the opposite direction towards said transducer.

A better understanding will be had of the invention from the ensuing description with reference to the accompanying drawings in which:

FIG. 5 shows an embodiment of the diagram shown in FIG. 1, and

FIG. 6 shows the diagram of a memory according to the invention employing elastic bulk waves.

In these various figures, on the one hand the same references are related to the same elements and on the other and the device and the signals have been shown to an arbitrarily chosen scale which is usually enlarged in order to render the drawing more clear.

Figure 1:
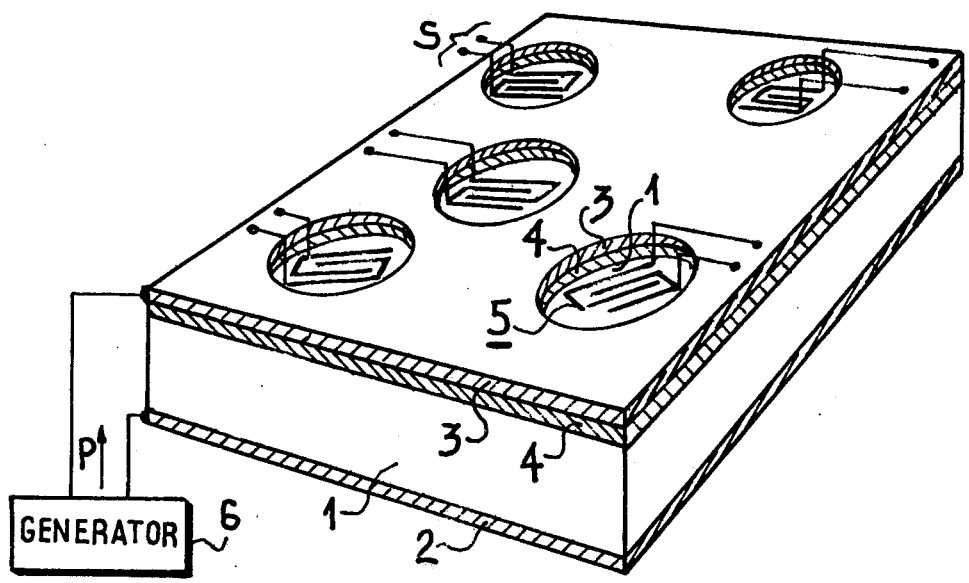
FIG. 1 shows the diagram of a memory according to the invention using elastic surface waves.
Figure 3:
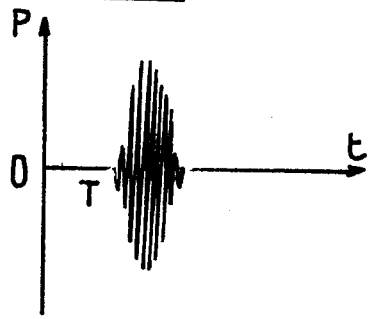

In FIG. 1 there are shown: a piezoelectric substrate 1 for example in the form of a plate or slab on the surface of which elastic waves may be propagated; a plurality of electromechanical transducers, such as 5, deposited on the surface of the substrate 1; one or more layers which are together designated by the reference numeral 4, and are composed of a material whose constitution and function will be explained hereinafter and deposited on the substrate 1 adjacent the transducers 5 and around the latters; electrodes 2 and 3 covering all or a part of the large sides of the substrate 1, openings being provided in the electrode 3 and in the layer 4 in the region of the transducers 5. The electrodes 2 and 3 are connected to a generator 6 of an electric signal P whose form is given in FIG. 3.

Figure 2:
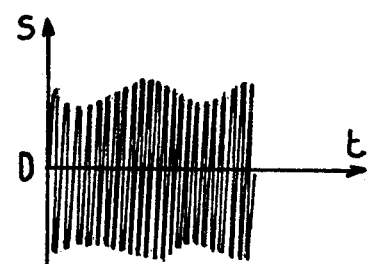
FIGS. 2 and 3 show the form of the electric signals used in the operation of a device according to the invention.

The transducers, such as 5, are for example of the interdigited comb type; in the example shown in FIG. 1 where the different layers are isotropic with respect of the plane of the plate, these transducers may be disposed in any orientation with respect to the surface of the substrate 1. The transducers, such as 5, are each excited by electric signals S which have an amplitude modulated angular frequency $\alpha$. An example of such a signal is shown in FIG. 2. The electric signals constitute the information to be memorized. The transducers thus excited produce elastic waves on the surface of the substrate 1 which are propagated in such manner as to occupy a certain time after their emission substantially circular areas centered on their transducer of origin.

Note that the different transducers may be excited simultaneously and that the aforementioned areas can overlap and interfere with each other without adversely affecting a correct operation of the device, as is shown in the ensuing description.

To simplify, the elastic surface waves emitted by a transducer, such as 5, will be termed S and characterized by the pair $(\alpha, \vec{k})$, $\vec{k}$ being the wave vector associated with the wave number $k=\alpha/v$ in which v is the propagation velocity the elastic wave on the substrate 1.

After a time T, at the end of which the area occupied by a signal S around its transducer of origin (for example the transducer 5) is sufficient, a very brief pulse P having a angular frequency $\alpha$, is applied between the electrodes 2 and 3. The electromagnetic wave propagated in the substrate will, for purposes of simplification, be termed P and characterized by the pair $(\alpha, o)$ in which the second term represents the wave vector of P associated with its wave number and considered as negligible with respect to k, as the wave number is defined as $\alpha/c$, the light velocity (c) being very high with respect to the propagation velocity (v) of elastic waves.

This pulse produces on the entire surface of the piezoelectric substrate 1 located under the electrode 3 an electric field which interacts in a non-linear manner with the field resulting, by the piezoelectric effect, from the network of strains due to the elastic wave S; this interaction induces surface waves which may be characterized by the pairs (angular frequency, wave vector) resulting from the sum and the difference of the pairs characterizing the waves which interact. There are thus obtained:

$(2\alpha, \vec{k})$ $(o, \vec{k})$ $(o, -\vec{k})$

The physical interpretation is the following:

the first case corresponds to the formation of a non-propagating disturbance (k being equal to $\alpha/v$) that is to say only existing during the duration of the interaction, localized in the interaction zone and varying with the double angular frequency time ($2\alpha$) of the signals S and P. It can therefore be neglected.

the second case corresponds to a time-independent spatial potential pattern, with a spatial pitch equal to $2\pi/k$ and existing during the period of interaction of the signals S and P in the aforementioned area, around the transducer from which the signal S originates.

the third case is identical to the preceding case, bearing in mind that, with the notation adopted here, the pair $(\alpha, \vec{k})$ and $(-\alpha, -\vec{k})$ represent the same surface wave which is propagated in the same direction.

There have therefore been obtained in the second case a periodic pattern of differentiated regions representing the signal S. However, as they exist only during the period of interaction, means are necessary for modifying the physical properties of the propagation medium so as to memorize this pattern; these changes of state should have a low time constant with respect to the duration of the pulse P. For this purpose there may be employed ferroelectric, magnetoelastic or semiconductor phenomena, depending on the nature of the substrate 1 and the composition of the layers 4. Embodiments thereof will be given hereinafter.

In order to read the information thus memorized, an electromagnetic wave is interacted with the memorized regions. The electromagnetic wave is produced as before by the application of a pulse, such as P, between the electrodes 2 and 3.

The non-linear interaction is characterized by the pairs (pulsation, wave vector) resulting from the sum and the difference of the pairs which interact, namely (o, $\vec{k}$) for the memorized pattern and ($\alpha$, o) for the signal P. In this way there are obtained:

$(\alpha, \vec{k})$ $(\alpha, -\vec{k})$ $(-\alpha, \vec{k})$ the first case represents an elastic wave which is propagated in a direction away from the transducer of origin 5 toward the periphery of the substrate, it being attenuated in the structure; it induces only signals without phase coherence in the multiple relfected paths which may possibly reach the transducer;

the second and the third pair in fact correspond to one and the same case and represent an elastic wave which is propagated in a coherent manner on the surface of the substrate in return toward the transducer of origin, then employed for reading.

Thus it is observed that each one of the transducers disposed on the substrate 1 receives in a coherent manner, after the non-linear reading interaction, only the signal S emitted thereby, the other signals which it is capable of receiving having no coherence therebetween and therefore constituting merely a noise factor. That return of the memorized signal on its transducer of origin has the advantage of allowing an any shapped transducer (an example of which is given on FIG. 4, hereinafter) and a multiple and simultaneous transducer workings.

Note that the signal S, which is read after memorization by its transducer of origin 5, is in fact returned in time.

In a various embodiment of the device shown in FIG. 1, it is possible to memorize the signal S upon its return to its transducer of origin 5, that is to say after a first memorizing. For this purpose, the signal S in return, characterized by the pair $(\alpha, -\vec{k})$, is interacted with an elastic surface wave emitted by the transducer of origin 5 of the signal S in the form of a pulse of angular frequency $\alpha$ whose form is given by FIG. 3, characterized by the pair $(\alpha, \vec{k})$. There are obtained as before three possible cases:

$(2\alpha, o)$ $(o, \vec{2k})$ $(o, -\vec{2k})$ among which the first may be neglected and the other two represent the same time-independant spatial potential pattern, with a pitch equal to $2\pi/2k$.

This state constituted by differentiated regions is memorized in the same manner, namely by the change of state of the propagation medium.

The information is read by a non-linear interaction between the memorized pattern (o, $\vec{2k}$) and an elastic surface wave $(\alpha, \vec{k})$ of pulsating form (as shown for exemple on FIG. 3) emitted by the transducer 5. The interaction furnishes a first term: $(\alpha, \vec{3k})$ which, being non-propagating, will be neglected and two other terms: $(-\alpha, \vec{k})$ and $(\alpha, -\vec{k})$ which are two equivalent expressions of the same surface wave, representing the signal S in its return to the transducer 5 which had initially emitted it.

Figure 4:
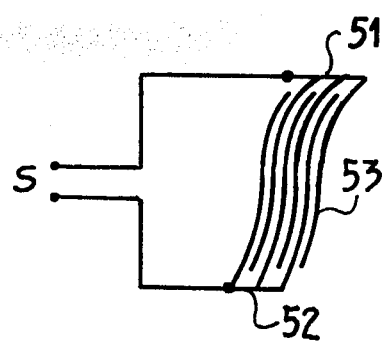
FIG. 4 shows a modification of a part of the device shown in FIG. 1.

FIG. 4 shows a variant embodiment of the transducers, such as 5, deposited on the surface of the substrate (FIG. 1).

It is also of the interdigital type, namely it comprises two combs 51 and 52 whose teeth 53 are parallel and interleaved, but the teeth 53 have a curved shape having a point of inflexion.

The non-rectilinear form of the teeth 53 is adapted to destroy the possible coherence of the elastic waves which travel along parasitic reflected paths when they are propagated on the substrate 1.

FIG. 5 shows a variant embodiment of the memory using elastic surface waves shown in FIG. 1, in which the memorizing of the pattern produced by non-linear interactions is effected by the MOS effect (Metal Oxide Semiconductor).

In this figure there is shown the substrate 1 covered with electrodes 2 and 3 connected to the generator 6, the electrode 3 being separated from the substrate by a thin air-gap 40, and an assembly of layers together represented by the reference numeral 4. The transducers, such as 5, deposited on the surface of the substrate 1 cannot be seen in the figure, for the sake of clarity.

The substrate 1 is constituted by a piezoelectric material such as lithium niobate $LiNbO_3$ or lead titanate zirconate PZT. The air gap 40 has for function to separate the layers 4 from the substrate 1 in order to allow the elastic waves to propagate freely on the surface of the substrate.

The assembly of layers 4 is constituted by, in succession and outwardly: a layer of silica 41; a layer of silicon 42 or amorphous semiconductor; a metallic electrode 43 connected by a connection 45 to an exterior polarization potential (not shown), and an isolating layer 44.

To memorize the pattern, if the layer of silicon 42 is of N-type, the electrode 43 is brought to a positive potential; there is then produced a weakening of majority carriers in the layer of silicon 42. There is a certain threshold difference of potential between the two sides of the dielectric 41 above which the minority carriers (positive in this example) in the silicon 42 accumulate at the interface 41-42. It is this phenomenon which is employed for memorizing the pattern, by polarizing (positively) the electrode 43 so that, when the surface of the substrate 1 is at uniform potential, it is just below the threshold potential. When the distribution of the potential on the surface of the substrate 1 has a positive part, the difference of potential between the two sides of the layer 41 remains lower than the threshold and no modification of the population of charge carriers occurs. In front of a negative part, the difference of potential between the two sides of the layer 41 becomes higher than the threshold and there occurs, on the contrary, an accumulation of minority carriers (positive) at the interface 41-42 which has for effect to fix the potential (negative) of the considered part and more generally the distribution of the potential on the surface of the substrate 1, which remains thus after ceasing the non-linear interaction which produced it.

Note that the layer of silicon 42 may be divided into two layers of different resistivity which are superposed, for example 10.000 Ω.cm. for one and 10 Ω.cm. for the other.

It will be understood that the pattern created by the elastic wave-electromagnetic wave interactions may be memorized by other means and in particular by the substrate itself. Note that the existence of the layer 4 is however prefered for isolating the surface of the substrate 1 from the electrode 3. There may be mentioned by way of example: the use of ferroelectric phenomena producing a local displacement of respective centres of gravity of positive and negative charges which thus fixes the potential of the considered region of the pattern, the substrate 1 being then made from piezoelectric ceramic material; or the use of magnetoelastic phenomena producing a local swing in the state of the atoms, particularly the orientation of their spin, in the region of the pattern to memorize, the substrate 1 being of ceramic material of the YAG type (Yttrium-Aluminium Garnet) or YIG type (Yttrium-Iron Garnet); or the effects of creation of traps for the charge carriers in a piezoelectric and semiconductor substrate 1 such as cadmium sulphide, the phenomenon employed being then the passage of the carriers in question in the forbidden energy bands, which carriers are thus trapped.

The memorizing device employing elastic surface waves described hereinbefore has various advantages among which may be mentioned a relatively high efficiency for non-linear interaction, due to the fact that the energy is concentrated on the surface of the device, and also the possibility of effecting various processings of the signals which, in propagating on the surface, are thus available and accessible.

According to the invention it is also possible to construct a memory employing bulk elastic waves which, although it does not have the aforementioned advantages, affords a higher capacity. The diagram of such a memory is shown in FIG. 6.

The device comprises a piezoelectric substrate 10, transducers 50 of elastic bulk waves and two electrodes 20 and 30 covering the surface of the substrate 10 around the transducers 50 and without contact with each other. The electrodes 20 and 30 are connected to a generator 60.

The transducers 50 may for example be constituted by a counter-electrode 54 deposited on the substrate 10 and covered with a piezoelectric layer 55 which is itself covered with an electrode 56; the electric signal to be memorized, termed S as before, is applied between the two electrodes 54 and 56.

This signal is memorized in an analogous manner, that is to say after creation of a pattern by non-linear interaction between the elastic bulk wave produced by the transducer 50 and the electromagnetic wave of the same angular frequency and in the pulsating form (previously termed P) produced between the electrodes 20 and 30. Likewise, the reading is carried out as in the surface wave device.

This device of course has the same feature than the one of FIG. 1, namely the return of the memorized signal toward and the reading by its transducer of origin, with the advantages which are inherent in this fact.

However, there is a difference with the surface wave device, that is, the pattern produced is in three dimensions and therefore cannot be memorized by one or more surface layers such as 4 (FIG. 1). It must therefore be memorized in the substrate 10 itself by using, for example, magnetoelastic or ferroelectric effects or effects of the creation of traps for the charge carrier described hereinbefore.

Note that for the same reasons as before, that is to say in order to destroy any possible coherence of parasitic elastic waves, the transducers such as 50 are preferably of irregular shape, that is to say non-planar.

The invention is not intended to be limited to the foregoing description which has been given merely by way of example. Thus an embodiment is also part of the invention in which the pattern fixing medium is distinct from the elastic wave propagation path; such an embodiment may be achieved by a piezoelectric and semiconductor medium (CdS) of storage by traps coupled to the path of propagation of the elastic waves by conductive bands disposed parallel with each other, with a small pitch with respect to the half wavelength of the elastic waves used.

What is claimed, is

1. A device for memorizing information employing elastic waves, comprising:

a piezoelectric substrate;

at least one electromechanical transducer deposited on a surface of said substrate, receiving said information in the form of an electric signal and emitting a first elastic wave;

first means for exciting a first electromagnetic field through the substrate, said electromagnetic field interacting with said elastic wave so as to produce a time-independent spatial charge pattern in said substrate, representing said information;

means for fixing said pattern in said substrate;

means for reading said information, constituted by second means for exciting a second electromagnetic field through the substrate, said second field interacting with said pattern so as to produce a second elastic wave, termed a reading wave, having the same characteristics as said first elastic wave but propagating in the opposite direction towards said transducer, said transducer generating an output electrical signal when receiving said reading wave, said output signal representing said information.

2. A device as claimed in claim 1, wherein said first excitation means comprise two electrodes placed on each side of the substrate, at least one of the electrodes being separated from the substrate by an isolating layer, between which electrodes there is applied a pulsating electric signal having the same angular frequency as said elastic wave.

3. A device as claimed in claim 1, wherein said first means for exciting a first electromagnetic field and said second means for exciting a second electromagnetic field are identical.

4. A device as claimed in claim 1, wherein said transducer emits elastic surface waves.

5. A device as claimed in claim 4, wherein said transducer is of the interdigital combs type, having non-rectilinear parallel teeth.

6. A device as claimed in claim 1, wherein said transducer emits elastic bulk waves.

7. A device as claimed in claim 6, wherein said transducer comprises electrodes having non-planar surfaces.

8. A device as claimed in claim 1, wherein said elastic reading wave is subjected to an interaction with a third elastic wave, termed a writing wave, produced by the same transducer and at the same pulsation as said first elastic wave, said interaction producing a second pattern which is fixed by said fixing means.

9. A device as claimed in claim 4, wherein said means for fixing the pattern are constituted by a dielectric layer placed in facing relation to the surface of the substrate which carries said transducer and without contact with said surface, the dielectric layer being covered in succession with at least one layer of semiconductor and a metallic layer connected to an exterior polarization potential.

10. A device as claimed in claim 9, wherein said first excitation means comprise two electrodes placed on each side of the substrate, at least one of the electrodes being separated from the substrate by an isolating layer, between which electrodes there is applied a pulsating electric signal having the same pulsation as said elastic wave and wherein one of said electrodes is placed on said metallic layer through an electric insulator.

11. A device as claimed in claim 9, further comprising a second layer of semiconductor whose conductivity differs from that of the first layer of semiconductor, placed between said first layer and the metallic layer.

12. A device as claimed in claim 1, wherein said fixing means are constituted by said substrate composed of a piezoelectric ceramic material, said fixing being achieved by a ferroelectric effect.

13. A device as claimed in claim 1, wherein said fixing means are constituted by said substrate composed of cadmium sulphide (CdS), said fixing being achieved by the effect of traps for the charge carriers.

14. A device as claimed in claim 1, wherein said fixing means are constituted by said substrate composed of ceramic material of the Yttrium-Aluminium Garnet type (YAG), said fixing being achieved by a magneto-elastic effect.

15. A device as claimed in claim 1, wherein said fixing means are constituted by said substrate composed of ceramic material of the Yttrium-Iron Garnet type (YIG), said fixing being achieved by a magnetoelastic effect.

16. A device as claimed in claim 1, comprising a plurality of independent electromechanical transducers, emitting a plurality of elastic wave, respectively corresponding to a plurality of information.

17. A method for memorizing an electric signal by means of an acoustic wave device, said device being of a type that includes:
a piezo-electric substrate;
at least one electromechanical transducer deposited on a surface of said substrate for generating elastic waves;
means for exciting electromagnetic fields through said substrate;
means for fixing a charge pattern within said substrate;
said method comprising the steps of:
producing a first interaction between a first wave, generated by said transducer when receiving said electrical signal to be memorized, termed the first signal, and a first electromagnetic field corresponding to a second electric signal, said first interaction generating a time-independent spatial charge pattern in said substrate, representing said first signal, said pattern being fixed by said fixing means; and
producing a second interaction between said pattern and a second electromagnetic field, corresponding to a third electric signal, said second interaction generating a second elastic wave, termed the reading wave, having the same characteristics as said first elastic wave but propagating in the opposite direction towards said transducer which generated said first wave.

18. The method of claims 17, wherein said second signal has the same angular frequency as said first elastic wave.

19. The method of claim 17, wherein said first and second elastic waves are surface waves.

20. The method of claim 17, wherein said first and second elastic waves are bulk waves.

21. The method of claim 17, wherein said first elastic wave has non-planar wave fronts.

22. The method of claim 17, further comprising the following step:
generating a fourth electric signal, termed the output signal, by means of said transducer when receiving said reading wave, said output signal representing said first signal.

23. The method of claim 17, further comprising the following step of:
producing a third interaction with a third elastic wave termed a writing wave, corresponding to a fifth electrical signal applied to said electromechanical transducer, said writing wave having the same angular frequency as said first elastic wave, said third interaction producing a further spatial charge pattern, which is fixed by said fixing means.

24. A method of memorizing a plurality of independent signals by means of an acoustic wave device, said device being of a type that includes:
a piezo-electric substrate;
a plurality of independent electromechanical transducers disposed on at least one surface of said substrate for generating elastic waves;
means for exciting electromagnetic fields through said substrate; and means for fixing a charge pattern within said substrate; said method comprising the steps of:

generating a plurality of elastic waves respectively by said plurality of transducers, corresponding to said plurality of independent signals to be memorized;

producing a first set of interactions between said elastic waves generated by said transducers when receiving said electrical signals to be memorized, termed the first signals, and a first electromagnetic field corresponding to a second electrical signal, said first interactions generating a time independent spatial charge pattern in said substrate, representing said first signals, said pattern being fixed by said means for fixing a charge pattern; and producing a second set of interactions between said fixed pattern and a second electromagnetic field corresponding to a third electrical signal, said second interactions generating a second elastic wave, termed the reading wave, having the same characteristics as said first elastic wave, but propagating in the opposite direction thereof towards transducers from which they were originally generated.

* * * * *